United States Patent
Shimizu et al.

(10) Patent No.: US 10,319,828 B2
(45) Date of Patent: Jun. 11, 2019

(54) SEMICONDUCTOR DEVICE WITH DIFFUSION PREVENTION LAYER

(71) Applicant: Kabushiki Kaisha Toshiba, Minato-ku (JP)

(72) Inventors: Tatsuo Shimizu, Shinagawa (JP); Hisashi Saito, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/963,305

(22) Filed: Apr. 26, 2018

(65) Prior Publication Data

US 2018/0248016 A1   Aug. 30, 2018

Related U.S. Application Data

(62) Division of application No. 15/252,413, filed on Aug. 31, 2016, now Pat. No. 9,991,358.

(30) Foreign Application Priority Data

Sep. 11, 2015   (JP) .................................. 2015-179038

(51) Int. Cl.
| | |
|---|---|
| *H01L 29/51* | (2006.01) |
| *H01L 29/16* | (2006.01) |
| *H01L 29/49* | (2006.01) |
| *H01L 29/778* | (2006.01) |
| *H01L 29/20* | (2006.01) |
| *H01L 29/78* | (2006.01) |

(52) U.S. Cl.
CPC ........ *H01L 29/518* (2013.01); *H01L 29/1608* (2013.01); *H01L 29/4916* (2013.01); *H01L 29/513* (2013.01); *H01L 29/517* (2013.01); *H01L 29/7786* (2013.01); *H01L 29/2003* (2013.01); *H01L 29/4966* (2013.01); *H01L 29/7802* (2013.01)

(58) Field of Classification Search
CPC ............. H01L 29/1608; H01L 29/2003; H01L 29/7786; H01L 29/4916; H01L 29/517; H01L 29/7802; H01L 29/4966; H01L 29/518
See application file for complete search history.

(56) References Cited

U.S. PATENT DOCUMENTS

| | | |
|---|---|---|
| 4,851,370 A | 7/1989 | Doklan et al. |
| 6,661,065 B2 | 12/2003 | Kunikiyo |

(Continued)

FOREIGN PATENT DOCUMENTS

| | | |
|---|---|---|
| JP | 01-204435 A | 8/1989 |
| JP | 11-111978 A | 4/1999 |

(Continued)

*Primary Examiner* — Thanh Y Tran
(74) *Attorney, Agent, or Firm* — Oblon, McClelland, Maier & Neustadt, L.L.P.

(57) ABSTRACT

A semiconductor device according to an embodiment includes a semiconductor region, a gate electrode, and a first gate insulating film provided between the semiconductor region and the gate electrode and containing a material having a chemical composition expressed by $(SiO_2)_n(Si_3N_4)_m$ (where n and m are positive integers), in the material, at least one silicon atom being bonded with at least one oxygen atom and at least one nitrogen atom.

9 Claims, 2 Drawing Sheets

(56) References Cited

U.S. PATENT DOCUMENTS

| | | | |
|---|---|---|---|
| 2004/0191151 A1 | 9/2004 | Kouvetakis et al. | |
| 2005/0258491 A1 | 11/2005 | Bojarczuk, Jr. et al. | |
| 2006/0175672 A1 | 8/2006 | Matsushita | |
| 2007/0018231 A1 | 1/2007 | Mitani | |
| 2007/0222003 A1 | 9/2007 | Matsushita et al. | |
| 2010/0044753 A1* | 2/2010 | Sugimoto | H01L 29/2003 |
| | | | 257/192 |
| 2010/0171169 A1 | 7/2010 | Mitani | |
| 2010/0327281 A1 | 12/2010 | Nakajima | |
| 2011/0017998 A1 | 1/2011 | Nakano et al. | |
| 2012/0012861 A1 | 1/2012 | Nakano et al. | |
| 2013/0256693 A1* | 10/2013 | Nakamura | H01L 23/291 |
| | | | 257/76 |
| 2014/0001572 A1 | 1/2014 | Bohr | |
| 2014/0159117 A1* | 6/2014 | Taniguchi | H01L 29/4232 |
| | | | 257/194 |
| 2017/0077240 A1 | 3/2017 | Shimizu et al. | |
| 2017/0077299 A1 | 3/2017 | Shimizu et al. | |

FOREIGN PATENT DOCUMENTS

| | | | |
|---|---|---|---|
| JP | 2003-109953 A | 4/2003 | |
| JP | 2005-514783 A | 5/2005 | |
| JP | 2005-328059 A | 11/2005 | |
| JP | 2006-216897 A | 8/2006 | |
| JP | 2011-100967 A | 5/2011 | |
| JP | 2012-104655 A | 5/2012 | |
| JP | 2017-055003 A | 3/2017 | |
| JP | 2017-55003 A | 3/2017 | |
| JP | 2017-55005 A | 3/2017 | |
| JP | 2017-055005 A | 3/2017 | |
| WO | WO 2010/110246 A1 | 9/2010 | |

\* cited by examiner

SEMICONDUCTOR DEVICE WITH DIFFUSION PREVENTION LAYER

CROSS-REFERENCE TO RELATED APPLICATION

This application is a divisional application of U.S. application Ser. No. 15/252,413, filed Aug. 31, 2016, which is based upon and claims the benefit of priority from Japanese Patent Application No. 2015-179038, filed on Sep. 11, 2015, the entire contents of which are incorporated herein by reference.

FIELD

Embodiments described herein relate generally to a semiconductor device.

BACKGROUND

In a transistor having an MIS (Metal Insulator Semiconductor) structure, there is a problem in which an impurity contained in a gate electrode diffuses into a gate insulating film and a semiconductor substrate to generate a characteristic fluctuation of the transistor.

For example, to suppress diffusion of the impurity, there is a technique of providing a diffusion prevention layer for the impurity between the gate electrode and the gate insulating film. However, for example, charges may be trapped by trapping levels in the diffusion prevention layer to cause an additional characteristic fluctuation of the transistor.

DETAILED DESCRIPTION

Figure 1:
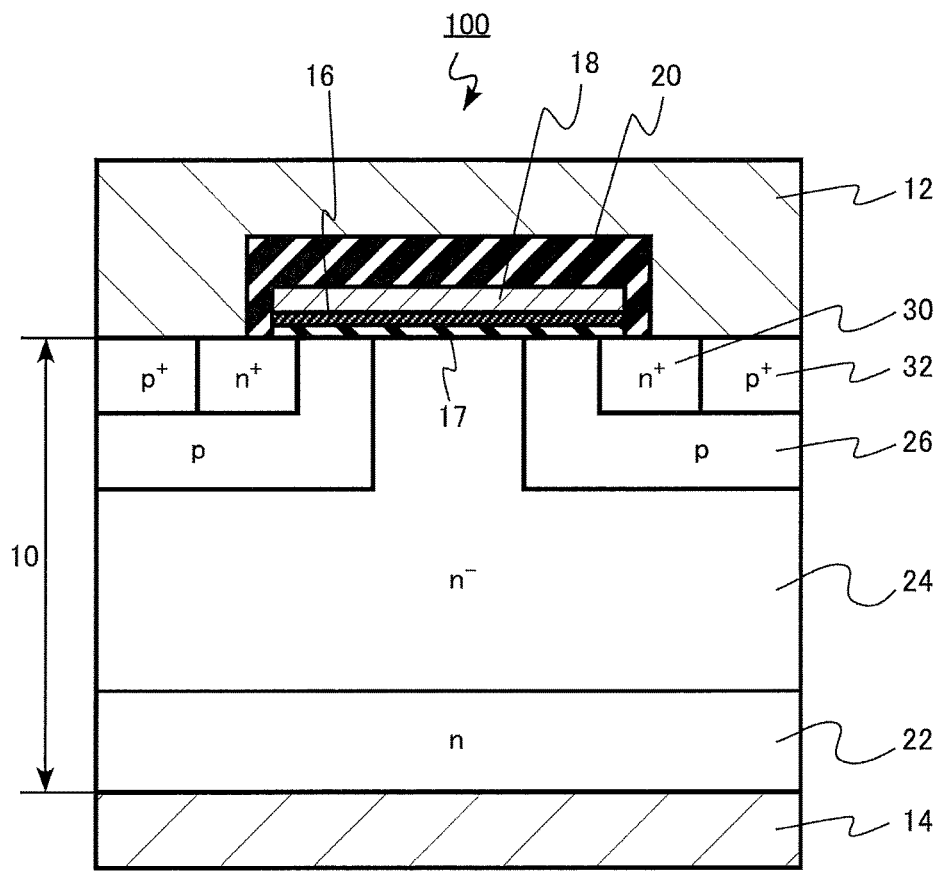
FIG. 1 is a schematic cross-sectional view illustrating a semiconductor device according to a first embodiment.

A semiconductor device according to an embodiment includes a semiconductor region, a gate electrode, and a first gate insulating film provided between the semiconductor region and the gate electrode, the first gate insulating film containing a first material having a chemical composition expressed by $(SiO_2)_n(Si_3N_4)_m$ (where n and m are positive integers), at least one silicon atom included in the first material being bonded with at least one oxygen atom and at least one nitrogen atom.

Hereinbelow, embodiments of the present disclosure will be described with reference to the drawings. It is to be noted that, in the following description, identical or similar members are shown with the same reference numerals, and description of the members described once is omitted.

Also, in the following description, symbols $n^+$, n, $n^-$, $p^+$, p, and $p^-$ represent relative levels of impurity concentration in respective conductivity types. That is, $n^+$ represents that the n-type impurity concentration thereof is relatively higher than that of n, and $n^-$ represents that the n-type impurity concentration thereof is relatively lower than that of n. Also, $p^+$ represents that the p-type impurity concentration thereof is relatively higher than that of p, and $p^-$ represents that the p-type impurity concentration thereof is relatively lower than that of p. It is to be noted that "$n^+$-type" and "$n^-$-type" may be expressed simply as "n-type," and that "$p^+$-type" and "$p^-$-type" may be expressed simply as "p-type" in some cases.

In the present description, "an SiC substrate" shall mean a concept including an SiC layer formed on a substrate by means of epitaxial growth.

First Embodiment

A semiconductor device according to the present embodiment includes a semiconductor region, a gate electrode, and a first gate insulating film provided between the semiconductor region and the gate electrode and containing a material having a chemical composition expressed by $(SiO_2)_n(Si_3N_4)_m$ (where n and m are positive integers), in the material, at least one silicon atom being bonded with at least one oxygen atom and at least one nitrogen atom.

FIG. 1 is a schematic cross-sectional view illustrating a configuration of a MOSFET serving as a semiconductor device according to the present embodiment. A MOSFET (Metal Oxide Semiconductor Field Effect Transistor) 100 is a Double Implantation MOSFET (DI MOSFET), in which a well region and a source region are formed by means of ion implantation, for example. The MOSFET 100 is an n-type MOSFET, in which carriers are electrons.

The MOSFET 100 includes an SiC substrate 10, a source electrode 12, a drain electrode 14, a first gate insulating film 16, a second gate insulating film 17, a gate electrode 18, and an interlayer dielectric film 20. The SiC substrate 10 includes a drain region 22, a drift region 24, a well region (semiconductor region) 26, a source region 30, and a well contact region 32.

The SiC substrate 10 is 4H-SiC, for example.

The SiC substrate 10 has a first plane and a second plane. In FIG. 1, the first plane is an upper plane in the figure, and the second plane is a lower plane in the figure. Hereinbelow, the first plane is referred to as a front side while the second plane is referred to as a backside.

A case in which the first plane is a plane inclined by 0 degrees or more and 8 degrees or less with respect to a (0001) face and in which the second plane is a plane inclined by 0 degrees or more and 8 degrees or less with respect to a (000-1) face will be described as an example. The (0001) face is referred to as a silicon face while the (000-1) face is referred to as a carbon face.

The drain region 22 is n-type SiC. The drain region 22 contains nitrogen (N) as an n-type impurity, for example. The concentration of the n-type impurity in the drain region 22 is $1\times10^{18}$ cm$^{-3}$ or higher and $1\times10^{21}$ cm$^{-3}$ or lower, for example.

From a viewpoint of reducing contact resistance between the drain electrode 14 and the drain region 22, the concentration of the n-type impurity on the second plane of the drain region 22 is preferably $1\times10^{19}$ cm$^{-3}$ or higher and more preferably $1\times10^{20}$ cm$^{-3}$ or higher.

The drift region 24 is provided on the drain region 22. The drift region 24 is $n^-$-type SiC formed on the drain region 22 by means of the epitaxial growth, for example. The thickness of the drift region 24 is 5 μm or longer and 150 μm or shorter, for example.

The drift region 24 contains nitrogen (N) as an n-type impurity, for example. The concentration of the n-type impurity in the drift region 24 is $5\times10^{15}$ cm$^{-3}$ or higher and $2\times10^{16}$ cm$^{-3}$ or lower, for example.

The well region 26 is provided on the drift region 24. The well region 26 is p-type SiC. The well region 26 is provided between the source region 30 and the drift region 24. The well region 26 functions as a channel region of the MOSFET 100.

The well region 26 contains aluminum (Al) as a p-type impurity, for example. The concentration of the p-type impurity in the well region 26 is $5\times10^{15}$ cm$^{-3}$ or higher and $1\times10^{18}$ cm$^{-3}$ or lower, for example. The depth of the well region 26 is 0.4 μm or longer and 0.8 μm or shorter, for example.

The source region 30 is provided in the well region 26. The source region 30 is n$^+$-type SiC. The source region 30 contains nitrogen (N) as an n-type impurity, for example. The concentration of the n-type impurity in the source region 30 is $1\times10^{18}$ cm$^{-3}$ or higher and $1\times10^{21}$ cm$^{-3}$ or lower, for example.

From a viewpoint of reducing contact resistance between the source electrode 12 and the source region 30, the concentration of the n-type impurity on the first plane of the source region 30 is preferably $1\times10^{19}$ cm$^{-3}$ or higher and more preferably $1\times10^{20}$ cm$^{-3}$ or higher.

The depth of the source region 30 is shorter than the depth of the well region 26 and 0.2 μm or longer and 0.4 μm or shorter, for example.

The well contact region 32 is provided in the well region 26. The well contact region 32 is provided on a side of the source region 30.

The well contact region 32 is p$^+$-type SiC. The well contact region 32 contains aluminum (Al) as a p-type impurity, for example. The concentration of the p-type impurity in the well contact region 32 is $1\times10^{18}$ cm$^{-3}$ or higher and $1\times10^{21}$ cm$^{-3}$ or lower, for example.

The depth of the well contact region 32 is shorter than the depth of the well region 26 and 0.2 μm or longer and 0.4 μm or shorter, for example.

The first gate insulating film 16 is provided between the source region 30, the well region 26, and the drift region 24 and the gate electrode 18. The first gate insulating film 16 is provided on the second gate insulating film 17. The first gate insulating film 16 functions as a diffusion prevention layer preventing an impurity contained in the gate electrode 18 as a dopant from diffusing.

The film thickness of the first gate insulating film 16 is 0.5 nm or longer and 30 nm or shorter, for example.

The first gate insulating film 16 substantially contains a first material having a chemical composition expressed by $(SiO_2)_n(Si_3N_4)_m$ (where n and m are positive integers). Meanwhile, n and m have only to be positive integers in a range of measurement tolerances and manufacturing variations. The actual range of the measurement tolerances and manufacturing variations can be approximately several % to 10% of stoichiometry. Also, in the material, at least one silicon (Si) atom is bonded with at least one oxygen (O) atom and at least one nitrogen (N) atom. It is preferable that the number of silicon atoms included in the first material bonded with at least one oxygen atom and at least one nitrogen atom is more than the number of silicon atoms bonded only with oxygen atoms and the number of silicon atoms included in the first material bonded with at least one oxygen atom and at least one nitrogen atom is more than the number of silicon atoms bonded only with nitrogen atoms.

In the first gate insulating film 16, units each including $(SiO_2)_n(Si_3N_4)_m$ (where n and m are positive integers) are repeatedly disposed. In each of the units, four silicon atoms, two oxygen atoms, and three nitrogen atoms are coordinated. In each of the units, at least one silicon (Si) atom is bonded with at least one oxygen (O) atom and at least one nitrogen (N) atom.

In other words, an SiO$_2$ crystal and an Si$_3$N$_4$ crystal are not deposited separately but are mixed to have another integrated stable structure. For example, the structure is a structure of sinoite. While SiO$_2$ includes only an Si—O bond, and Si$_3$N$_4$ includes only an Si—N bond, $(SiO_2)_n(Si_3N_4)_m$ includes at least an O—Si—N bond, which has a different structure from that of SiO$_2$ or Si$_3$N$_4$.

The first gate insulating film 16 is preferably amorphous. Here, the amorphous state is a state in which the first gate insulating film 16 is ordered similarly to a crystal over a short distance and is disordered over a long distance. An electron state thereof can be regarded as being similar to that of the crystal.

In $(SiO_2)_n(Si_3N_4)_m$ (where n and m are positive integers), n≤m is preferably established. The reason for this is that the three-coordinated nitrogen atoms easily form a more concentrated film than the two-coordinated oxygen atoms.

Also, using only SiO$_2$ or Si$_3$N$_4$ easily causes deviation from stoichiometry and easily causes a characteristic degradation such as charge trapping. Conversely, by using $(SiO_2)_n(Si_3N_4)_m$ (where n and m are positive integers), the number of elemental species increases, and randomness of elemental disposition increases, which causes entropy to increase. As a result, the deviation from stoichiometry is reduced, and the characteristic degradation such as the charge trapping is reduced. In particular, with long-time annealing, the film gets close to a most stable structure, and the deviation from stoichiometry can mostly be prevented. In other words, by increasing the number of elemental species and increasing the randomness, a film whose ratio of a chemical composition is close to an integer ratio without limit can be formed, and a film whose ratio of a chemical composition is substantially the integer ratio can be formed. In cases of increasing the number of elemental species by other combinations described in the following embodiments, the deviation from stoichiometry is reduced, and the characteristic degradation such as the charge trapping is reduced in a similar manner. This is a significant difference from a film including only SiO$_2$, a film including only Si$_3$N$_4$, or a stacked film of SiO$_2$ and Si$_3$N$_4$.

Actually, an Si$_3$N$_4$ film easily deviates from stoichiometry and is used as a charge trapping film. This means that using the Si$_3$N$_4$ film as a gate insulating film of an SiC-MOSFET is one of the reasons for causing a fluctuation in threshold voltage and thus requires a special care. As one direction of the care, Si$_3$N$_4$ is mixed with SiO$_2$ at an integer ratio to bring a state of having another crystal structure so as to obtain a film in which the deviation from stoichiometry is kept to the minimum and in which the characteristic degradation such as the charge trapping is prevented.

Figure 2:
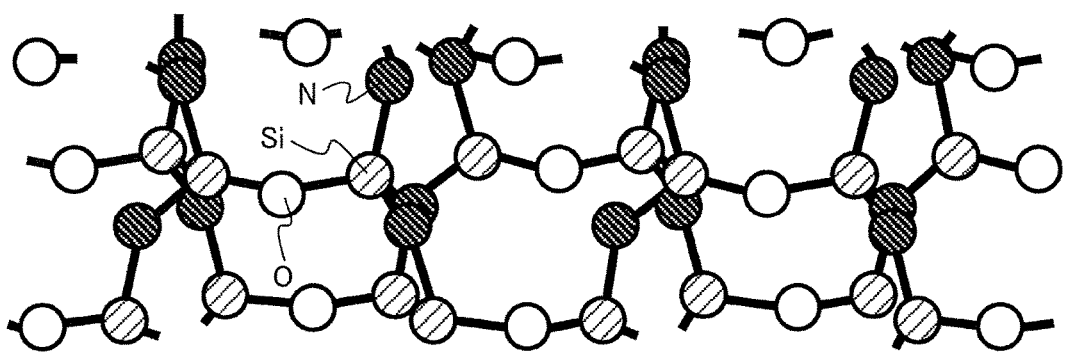
FIG. 2 illustrates an example of a structure of a material for a first gate insulating film according to the first embodiment.

FIG. 2 illustrates an example of a structure of a material for the first gate insulating film according to the present embodiment. The material illustrated in FIG. 2 is sinoite. The sinoite has a composition of n=m=1 in the above chemical composition formula. That is, the sinoite is a material having a composition of Si$_2$N$_2$O.

In the first gate insulating film 16, units each including $(SiO_2)(Si_3N_4)$ are repeatedly disposed as illustrated in FIG. 2. In each of the units, four silicon atoms, two oxygen atoms, and three nitrogen atoms are coordinated. In this structure, one silicon (Si) atom is bonded with one oxygen (O) atom and three nitrogen (N) atoms.

To form the first gate insulating film 16, by depositing n atomic layers of SiO$_2$ and m atomic layers of Si$_3$N$_4$ by means of an ALD (Atomic Layer Deposition) method, for example, and performing a high-temperature annealing process at approximately 1000° C. per deposition process, an ultrathin-film $(SiO_2)_n(Si_3N_4)_m$ structure in which the deviation from stoichiometry is 1% or less can be formed. By repeating this process, a thick-film structure can be formed.

The first gate insulating film 16 can also be formed by repeating deposition of n atomic layers of $SiO_2$ and m atomic layers of $Si_3N_4$ by means of the ALD (Atomic Layer Deposition) method, for example, and performing the annealing process collectively. However, in this case, since reactions of upper and lower layers need to be induced uniformly, a very thick film may not be formed. The reason form this is that the films deposited on the upper side cause the degree of freedom of the lower films in a film thickness direction to be limited. For this reason, in this collective manufacturing method, the film thickness is preferably less than 20 nm and more preferably less than 15 nm.

The chemical composition of the material for the first gate insulating film 16 can be identified by means of SIMS (Secondary Ion Mass Spectroscopy), for example. Also, the bonding state of the atoms and relative amount of the different bonding state of the atoms in the material for the first gate insulating film 16 can be identified by means of XPS (X-ray Photoelectron Spectroscopy) or FT-IR (Fourier Transform Infrared Spectroscopy).

Whether or not the first gate insulating film 16 is amorphous can be determined with use of a TEM (Transmission Electron Microscope). In terms of the material for the first gate insulating film 16, in a case in which no crystal grain boundaries can be observed by the TEM, it can be determined that the material is amorphous.

Whether or not the first gate insulating film 16 contains sinoite can be identified by means of the XRD, for example.

The second gate insulating film 17 is formed on the source region 30, the well region 26, and the drift region 24. The second gate insulating film 17 is formed between the source region 30, the well region 26, and the drift region 24 and the first gate insulating film 16.

The second gate insulating film 17 is made of a different material from that for the first gate insulating film 16. The second gate insulating film 17 includes a second material different from the first material included in the first gate insulating film 16. The second gate insulating film 17 is oxide, nitride, or oxynitride, for example. To the second gate insulating film 17, silicon oxide, hafnium oxide, zirconium oxide, aluminum oxide, silicon nitride, silicon oxynitride, hafnium oxynitride, zirconium oxynitride, aluminum oxynitride, and the like can be applied. The second gate insulating film 17 is preferably silicon oxide from a viewpoint of stabilizing a characteristic of the MOSFET.

The gate electrode 18 is provided on the first gate insulating film 16. The gate electrode 18 is silicon containing boron (B) as a p-type impurity, for example. The gate electrode 18 is polycrystalline silicon.

The concentration of the boron contained in the gate electrode 18 is preferably $1\times10^{19}$ $cm^{-3}$ or higher and more preferably $1\times10^{20}$ $cm^{-3}$ or higher from a viewpoint of metalizing the gate electrode 18.

The interlayer dielectric film 20 is provided on the gate electrode 18. The interlayer dielectric film 20 is a silicon oxide film, for example.

The well region 26 interposed between the source region 30 and the drift region 24 below the gate electrode 18 functions as a channel region for the MOSFET 100.

The source electrode 12 is provided on the front side of the SiC substrate 10. The source electrode 12 is electrically connected to the source region 30 and the well contact region 32. The source electrode 12 contacts the well contact region 32 and the source region 30. The source electrode 12 has a function of giving an electric potential to the well region 26.

The source electrode 12 is metal. The metal forming the source electrode 12 is a stacked structure of nickel (Ni) and aluminum (Al), for example. The metal forming the source electrode 12 is allowed to react with the SiC substrate 10 to form metallic silicide or metallic carbide.

The drain electrode 14 is provided on the backside of the SiC substrate 10. The drain electrode 14 is electrically connected to the drain region 22.

The drain electrode 14 is metal. The metal forming the drain electrode 14 is an alloy (NiAl) of nickel and aluminum, for example.

Hereinbelow, functions and effects of the semiconductor device according to the present embodiment will be described.

It is required from a viewpoint of achieving a low-power-consumption device to restrict leak current in an off state of the MOSFET. To restrict leak current in an off state of the MOSFET, threshold voltage of the MOSFET needs to be raised.

For example, to raise the threshold voltage of the n-type MOSFET, considered is an idea of making an energy level at an upper end of a valence band of the p-type channel-region semiconductor closer to work function of the gate electrode. In an off state of the MOSFET, energy bands of the semiconductor bend so that a Fermi level of the p-type channel region and work function of the gate electrode may correspond to each other. The Fermi level of the p-type channel region is located close to the upper end of the valence band of the p-type channel-region semiconductor. Thus, by making the energy level at the upper end of the valence band of the p-type channel-region semiconductor closer to the work function of the gate electrode, the energy band bending of the semiconductor in the off state of the MOSFET is restricted. Accordingly, the threshold voltage of the MOSFET is raised.

Figure 3:
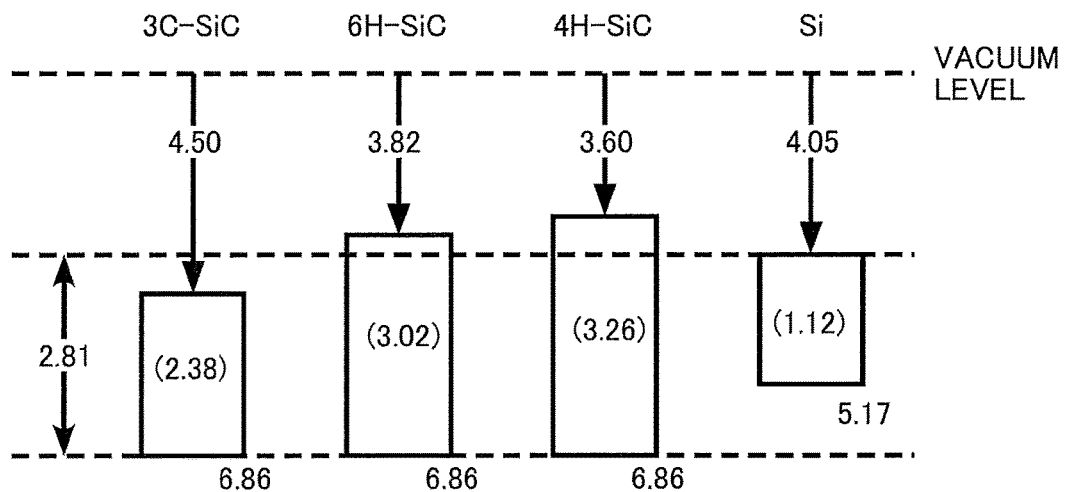
FIG. 3 illustrates functions and effects of the semiconductor device according to the first embodiment.

FIG. 3 illustrates functions and effects of the semiconductor device according to the present embodiment. FIG. 3 illustrates calculation results of energy band structures of semiconductors obtained by means of first principle calculation.

FIG. 3 illustrates energy band structures of silicon (Si), 4H-SiC, 6H-SiC, and 3C-SiC. FIG. 3 illustrates an energy difference between a vacuum level and an energy level at a lower end of a conduction band (electron affinity), an energy difference between the vacuum level and an energy level at an upper end of a valence band, and bandgap energy for each material. In the figure, values in brackets are bandgap energy.

Meanwhile, the work function is an energy difference between the vacuum level (vacuum energy level) and the Fermi level (Fermi level) of a target substance. Also, the electron affinity is a difference between the vacuum level (vacuum energy level) and the energy level at the lower end of the conduction band (energy level) of a target substance.

Also, in a case in which an n-type impurity is introduced into a semiconductor to metalize the semiconductor, it can be deemed that the Fermi level of the semiconductor corresponds to the energy level at the lower end of the conduction band. Thus, it can be deemed that the work function of the semiconductor corresponds to the electron affinity. Also, in a case in which a p-type impurity is introduced into a semiconductor to metalize the semiconductor, it can be deemed that the Fermi level of the semiconductor corresponds to the energy level at the upper end of the valence band. Thus, it can be deemed that the work function of the semiconductor corresponds to the energy difference between the vacuum level and the energy level at the upper end of the valence band.

As in the present embodiment, in a case in which the p-type channel region is 4H-SiC, the threshold voltage of the MOSFET is higher in a case of using p-type silicon as the gate electrode than in a case of using n-type silicon as the gate electrode. The reason for this is that, as illustrated in FIG. 3, the work function of the p-type silicon (energy difference between the vacuum level and the energy level at the upper end of the valence band) is closer to the energy level at the upper end of the valence band of the 4H-SiC semiconductor than the work function of the n-type silicon (energy difference between the vacuum level and the energy level at the lower end of the conduction band (electron affinity)). In the case of using the p-type silicon as the gate electrode, the threshold voltage can be raised by 1.12 V, which is equivalent to the bandgap energy of the silicon, in comparison to the case of using the n-type silicon as the gate electrode.

In the present embodiment, to the gate electrode 18, silicon containing boron as a p-type impurity is applied. In the case in which the boron is contained in the gate electrode 18 as the p-type impurity, diffusion of the boron caused by a thermal treatment at the time of forming the gate electrode is problematic.

In the high-temperature thermal treatment, the boron diffuses in the gate insulating film and the SiC substrate. The diffusing boron can form trapping levels and cause a characteristic fluctuation of the MOSFET, for example. An example of the characteristic fluctuation of the MOSFET is a fluctuation in threshold voltage. Thus, reliability of the MOSFET is lowered. In particular, in a case in which the p-type impurity in the gate electrode is boron, which has a short atomic radius and diffuses quickly, the problem of the characteristic fluctuation of the MOSFET is more serious.

In the present embodiment, the first gate insulating film 16 having a chemical composition expressed by $(SiO_2)_n(Si_3N_4)_m$ (where n and m are positive integers) is provided between the second gate insulating film 17 and the gate electrode 18. The first gate insulating film 16 functions as a diffusion prevention layer for the boron in the gate electrode 18.

For example, silicon nitride ($Si_3N_4$) can prevent diffusion of the impurity such as the boron. However, in the silicon nitride ($Si_3N_4$), the density of the trapping levels in the material is high. For this reason, when the silicon nitride is used as the gate insulating film, charge trapping may occur, which may cause the characteristic fluctuation of the MOSFET. Accordingly, the reliability of the MOSFET may be lowered.

The reason that the density of the trapping levels is high in the silicon nitride may be that, when the high-temperature thermal treatment is applied, defects (dangling bonds) are generated in the material to increase entropy.

Also, the silicon nitride may be poly-crystallized in the high-temperature thermal treatment. Due to presence of the defects generated in the thermal treatment, the atoms move easily, which facilitates amorphous-to-polycrystalline transformation. When the gate insulating film is poly-crystallized, gate leakage current increases, which is problematic.

The material having a chemical composition expressed by $(SiO_2)_n(Si_3N_4)_m$ (where n and m are positive integers) in the present embodiment is a binary system of $SiO_2$ and $Si_3N_4$.

Also, three kinds of atoms having different coordination numbers are mixed. Even when the thermal treatment is applied to this material, since the binary material containing the three kinds of atoms having different coordination numbers is mixed to cause entropy to increase, a stoichiometric chemical composition is easily achieved, the defects (dangling bonds) are rarely generated, and a dense structure similar to close packing is easily formed. Also, since the defects are rarely generated in the material, the amorphous-to-polycrystalline transformation rarely occurs.

According to the present embodiment, since the first gate insulating film 16 has a dense structure, diffusion of the impurity contained in the gate electrode as a dopant is effectively restricted. Also, since the density of the trapping levels in the first gate insulating film 16 is low, the charge trapping rarely occurs, and lowering of the reliability of the MOSFET is restricted. Further, since the first gate insulating film 16 is amorphous, the increase in gate leakage current is restricted.

In addition, $(SiO_2)_n(Si_3N_4)_m$ exerts a diffusion prevention effect for hydrogen (H) as well as the diffusion prevention effect for the impurity such as the boron contained in the gate electrode 18. Accordingly, a characteristic fluctuation of the MOSFET caused by diffusion of the hydrogen in the semiconductor region can be restricted, for example.

Meanwhile, in terms of n and m in $(SiO_2)_n(Si_3N_4)_m$ (where n and m are positive integers), n≤m is preferable, and n<m is more preferable. By increasing the ratio of $Si_3N_4$, which is denser than $SiO_2$, the denser gate insulating film can be achieved. Accordingly, the diffusion prevention effect for the impurity is improved.

As described above, according to the present embodiment, the MOSFET 100 having high threshold voltage and high reliability is achieved.

Second Embodiment

A semiconductor device in the present embodiment is similar to that in the first embodiment except that the gate electrode is 3C-SiC. Accordingly, description of the duplicate contents with those in the first embodiment is omitted.

A MOSFET according to the present embodiment will be described with reference to FIGS. 1 and 3.

The gate electrode 18 in the MOSFET according to the present embodiment is 3C-SiC containing boron as a p-type impurity. The gate electrode 18 is polycrystalline 3C-SiC.

In a case in which the p-type channel region is 4H—SiC, the threshold voltage can additionally be higher in a case of using p-type 4H-SiC as the gate electrode than in a case of using p-type silicon as the gate electrode. The reason for this is that work function of the p-type 4H-SiC corresponds to an energy level at an upper end of a valence band of the 4H-SiC semiconductor.

The threshold voltage can be raised by 2.81 V in comparison to the case of using the n-type silicon as the gate electrode. Also, the threshold voltage can be raised by 1.69 V in comparison to the case of using the p-type silicon as the gate electrode.

In the present embodiment, to the gate electrode 18, the p-type 3C-SiC containing the p-type impurity is applied. As illustrated in FIG. 3, it is clear from the first principle calculation that 3C-SiC and 4H-SiC have equal energy levels at the upper ends of the valence bands. Accordingly, in a case of applying the p-type 3C-SiC to the gate electrode, as well as in a case of applying the p-type 4H-SiC, the threshold voltage can be raised by 2.81 V in comparison to the case of using the n-type silicon as the gate electrode.

Also, the threshold voltage can be raised by 1.69 V in comparison to the case of using the p-type silicon as the gate electrode.

In the case in which the boron is contained in the SiC gate electrode as the p-type impurity, diffusion of the boron caused by a thermal treatment at the time of forming the gate electrode is problematic. For example, in a case of introducing the boron in 4H-SiC to activate the boron, a thermal treatment at 1600° C. or higher is required.

3C-SiC is a crystal form which is stable at lower temperatures than a crystal form of 4H-SiC, 6H-SiC, or the like. The 3C-SiC can form a crystal and activate the p-type impurity at a low maximum temperature of 1200° C. or lower.

In the present embodiment, the 3C-SiC, which can form a crystal at a low temperature, is applied to the gate electrode 18. Accordingly, diffusion of the p-type impurity due to the thermal treatment at the time of forming the gate electrode is restricted.

According to the present embodiment, due to the similar functions to those in the first embodiment, diffusion of the impurity is restricted by the first gate insulating film 16, and the MOSFET having high reliability is achieved. Also, by applying the 3C-SiC to the gate electrode 18, the MOSFET having higher threshold voltage than that in the first embodiment can be achieved. Further, by applying the 3C-SiC to the gate electrode 18, diffusion of the impurity is restricted further than in the case of applying the 4H-SiC to the gate electrode 18.

Third Embodiment

A semiconductor device according to the present embodiment includes a semiconductor region, a gate electrode, and a first gate insulating film provided between the semiconductor region and the gate electrode and substantially containing a material having a chemical composition expressed by $(SiO_2)_n(AlN)_m$ (where n and m are positive integers), in the material, at least one silicon atom or one aluminum atom being bonded with at least one oxygen atom and at least one nitrogen atom.

The semiconductor device in the present embodiment is similar to that in the first embodiment except that a material for the first gate insulating film 16 is different. Accordingly, description of the duplicate contents with those in the first embodiment is omitted.

A MOSFET according to the present embodiment will be described with reference to FIG. 1.

The first gate insulating film 16 substantially contains a material having a chemical composition expressed by $(SiO_2)_n$ $(AlN)_m$ (where n and m are positive integers). Meanwhile, n and m have only to be positive integers in a range of measurement tolerances and manufacturing variations. Also, in the material, at least one silicon atom or one aluminum atom is bonded with at least one oxygen atom and at least one nitrogen atom. It is preferable that the number of silicon atoms included in the first material bonded with at least one oxygen atom and at least one nitrogen atom is more than the number of silicon atoms bonded only with oxygen atoms and the number of silicon atoms included in the first material bonded with at least one oxygen atom and at least one nitrogen atom is more than the number of silicon atoms bonded only with nitrogen atoms. And, it is preferable that the number of aluminum atoms included in the first material bonded with at least one oxygen atom and at least one nitrogen atom is more than the number of aluminum atoms bonded only with oxygen atoms and the number of aluminum atoms included in the first material bonded with at least one oxygen atom and at least one nitrogen atom is more than the number of aluminum atoms bonded only with nitrogen atoms.

In the first gate insulating film 16, units each including $(SiO_2)_n(AlN)_m$ (where n and m are positive integers) are repeatedly disposed. In each of the units, four silicon atoms, three aluminum atoms, two oxygen atoms, and three nitrogen atoms are coordinated. In each of the units, at least one silicon (Si) atom or one aluminum (Al) atom is bonded with at least one oxygen (O) atom and at least one nitrogen (N) atom.

In other words, an $SiO_2$ crystal and an AlN crystal are not deposited separately but are mixed to have another integrated stable structure. For example, the structure is a structure of α sialon. While $SiO_2$ includes only an Si—O bond, and AlN includes only an Al—N bond, $(SiO_2)_n(AlN)_m$ includes at least an O—Si—N bond or O—Al—N bond, which has a different structure from that of $SiO_2$ or AlN.

The first gate insulating film 16 is amorphous.

In $(SiO_2)_n(AlN)_m$ (where n and m are positive integers), n≤m is preferably established, and n<m is more preferably established.

A material for the first gate insulating film 16 is $SiAlO_2N$, for example. In this case, n=m=1 is established in the above chemical composition formula.

To form the first gate insulating film 16, by depositing n atomic layers of $SiO_2$ and m atomic layers of AlN by means of an ALD (Atomic Layer Deposition) method, for example, and performing a high-temperature annealing process at approximately 1000° C. per deposition process, an ultrathin-film $(SiO_2)_n(AlN)_m$ structure in which the deviation from stoichiometry is 1% or less can be formed. By repeating this process, a thick-film structure can be formed.

The first gate insulating film 16 can also be formed by repeating deposition of n atomic layers of $SiO_2$ and m atomic layers of AlN by means of the ALD (Atomic Layer Deposition) method, for example, and performing the annealing process collectively. However, in this case, since reactions of upper and lower layers need to be induced uniformly, a very thick film may not be formed. The reason form this is that the films deposited on the upper side cause the degree of freedom of the lower films in a film thickness direction to be limited. For this reason, in this collective manufacturing method, the film thickness is preferably less than 20 nm and more preferably less than 15 nm.

The chemical composition of the material for the first gate insulating film 16 can be identified by means of SIMS (Secondary Ion Mass Spectroscopy), for example. Also, the bonding state of the atoms in the material for the first gate insulating film 16 can be identified by means of XRD (X-Ray Diffraction).

Whether or not the first gate insulating film 16 is amorphous can be determined with use of a TEM (Transmission Electron Microscope). In terms of the material for the first gate insulating film 16, in a case in which no crystal grain boundaries can be observed by the TEM, it can be determined that the material is amorphous.

In the present embodiment, the first gate insulating film 16 having a chemical composition expressed by $(SiO_2)_n(AlN)_m$ (where n and m are positive integers) is provided between the second gate insulating film 17 and the gate electrode 18. The first gate insulating film 16 functions as a diffusion prevention layer for boron in the gate electrode 18.

For example, aluminum nitride (AlN) can prevent diffusion of the impurity such as the boron. However, in the aluminum nitride, the density of the trapping levels in the material is high. For this reason, when the aluminum nitride is used as the gate insulating film, charge trapping may occur, which may cause the characteristic fluctuation of the MOSFET. Accordingly, the reliability of the MOSFET may be lowered.

The reason that the density of the trapping levels is high in the aluminum nitride may be that, when the high-temperature thermal treatment is applied, defects (dangling bonds) are generated in the material to increase entropy.

Also, the aluminum nitride may be poly-crystallized in the high-temperature thermal treatment. Due to presence of the defects generated in the thermal treatment, the atoms move easily, which facilitates amorphous-to-polycrystalline transformation. When the gate insulating film is poly-crystallized, gate leakage current increases, which is problematic.

The material having a chemical composition expressed by $(SiO_2)_n(AlN)_m$ (where n and m are positive integers) in the present embodiment is a binary system of $SiO_2$ and AlN. Also, four kinds of atoms having different coordination numbers are mixed. Even when the thermal treatment is applied to this material, since the binary material containing the four kinds of atoms having different coordination numbers is mixed to cause entropy to increase, a stoichiometric chemical composition is easily achieved, the defects (dangling bonds) are rarely generated, and a dense structure similar to close packing is easily formed. Also, since the defects are rarely generated in the material, the amorphous-to-polycrystalline transformation rarely occurs.

According to the present embodiment, since the first gate insulating film 16 has a dense structure, diffusion of the impurity contained in the gate electrode 18 as a dopant is effectively restricted. Also, since the density of the trapping levels in the first gate insulating film 16 is low, the charge trapping rarely occurs, and lowering of the reliability of the MOSFET is restricted. Further, since the first gate insulating film 16 is amorphous, the increase in gate leakage current is restricted.

In addition, $(SiO_2)_n(AlN)_m$ exerts a diffusion prevention effect for hydrogen (H) as well as the diffusion prevention effect for the impurity such as the boron contained in the gate electrode 18. Accordingly, a characteristic fluctuation of the MOSFET caused by diffusion of the hydrogen in the semiconductor region can be restricted, for example.

Meanwhile, in terms of n and m in $(SiO_2)_n(AlN)_m$ (where n and m are positive integers), n≤m is preferable, and n<m is more preferable. By increasing the ratio of AlN, which is denser than $SiO_2$, the denser gate insulating film can be achieved. Accordingly, the diffusion prevention effect for the impurity is improved.

According to the present embodiment, the MOSFET having high threshold voltage and high reliability is achieved.

Fourth Embodiment

A semiconductor device according to the present embodiment includes a semiconductor region, a gate electrode, and a first gate insulating film provided between the semiconductor region and the gate electrode and substantially containing a material having a chemical composition expressed by $(Si_3N_4)_n(Al_2O_3)_m$ (where n and m are positive integers), in the material, at least one silicon atom or one aluminum atom being bonded with at least one oxygen atom and at least one nitrogen atom.

The semiconductor device in the present embodiment is similar to that in the first embodiment except that a material for the first gate insulating film 16 is different. Accordingly, description of the duplicate contents with those in the first embodiment is omitted.

A MOSFET according to the present embodiment will be described with reference to FIG. 1.

The first gate insulating film 16 substantially contains a material having a chemical composition expressed by $(Si_3N_4)_n(Al_2O_3)_m$ (where n and m are positive integers). Meanwhile, n and m have only to be positive integers in a range of measurement tolerances and manufacturing variations. Also, in the material, at least one silicon atom or one aluminum atom is bonded with at least one oxygen atom and at least one nitrogen atom. It is preferable that the number of silicon atoms included in the first material bonded with at least one oxygen atom and at least one nitrogen atom is more than the number of silicon atoms bonded only with oxygen atoms and the number of silicon atoms included in the first material bonded with at least one oxygen atom and at least one nitrogen atom is more than the number of silicon atoms bonded only with nitrogen atoms. And, it is preferable that the number of aluminum atoms included in the first material bonded with at least one oxygen atom and at least one nitrogen atom is more than the number of aluminum atoms bonded only with oxygen atoms and the number of aluminum atoms included in the first material bonded with at least one oxygen atom and at least one nitrogen atom is more than the number of aluminum atoms bonded only with nitrogen atoms.

In the first gate insulating film 16, units each including $(Si_3N_4)_n(Al_2O_3)_m$ (where n and m are positive integers) are repeatedly disposed. In each of the units, four silicon atoms, three aluminum atoms, two oxygen atoms, and three nitrogen atoms are coordinated. In each of the units, at least one silicon (Si) atom or one aluminum (Al) atom is bonded with at least one oxygen (O) atom and at least one nitrogen (N) atom.

In other words, an $Si_3N_4$ crystal and an $Al_2O_3$ crystal are not deposited separately but are mixed to have another integrated stable structure. For example, the structure is a structure of β sialon. While $Si_3N_4$ includes only an Si—N bond, and $Al_2O_3$ includes only an Al—O bond, $(Si_3N_4)_n(Al_2O_3)_m$ includes at least an O—Si—N bond or O—Al—N bond, which has a different structure from that of $Si_3N_4$ or $Al_2O_3$.

The first gate insulating film 16 is amorphous.

In $(Si_3N_4)_n(Al_2O_3)_m$ (where n and m are positive integers), n≤m is preferably established, and n<m is more preferably established.

A material for the first gate insulating film 16 is $Si_3Al_2O_3N_4$, for example. In this case, n=m=1 is established in the above chemical composition formula. Also, a material for the first gate insulating film 16 is $Si_3Al_4O_6N_4$, for example. In this case, n=1 and m=2 are established in the above chemical composition formula.

To form the first gate insulating film 16, by depositing n atomic layers of $Si_3N_4$ and m atomic layers of $Al_2O_3$ by means of an ALD (Atomic Layer Deposition) method, for example, and performing a high-temperature annealing process at approximately 1000° C. per deposition process, an ultrathin-film $(Si_3N_4)_n(Al_2O_3)_m$ structure in which the deviation from stoichiometry is 1% or less can be formed. By repeating this process, a thick-film structure can be formed.

The first gate insulating film 16 can also be formed by repeating deposition of n atomic layers of $Si_3N_4$ and m atomic layers of $Al_2O_3$ by means of the ALD (Atomic Layer Deposition) method, for example, and performing the annealing process collectively. However, in this case, since reactions of upper and lower layers need to be induced uniformly, a very thick film may not be formed. The reason form this is that the films deposited on the upper side cause the degree of freedom of the lower films in a film thickness direction to be limited. For this reason, in this collective manufacturing method, the film thickness is preferably less than 20 nm and more preferably less than 15 nm.

The chemical composition of the material for the first gate insulating film 16 can be identified by means of SIMS (Secondary Ion Mass Spectroscopy), for example. Also, the bonding state of the atoms in the material for the first gate insulating film 16 can be identified by means of XRD (X-Ray Diffraction).

Whether or not the first gate insulating film 16 is amorphous can be determined with use of a TEM (Transmission Electron Microscope). In terms of the material for the first gate insulating film 16, in a case in which no crystal grain boundaries can be observed by the TEM, it can be determined that the material is amorphous.

In the present embodiment, the first gate insulating film 16 having a chemical composition expressed by $(Si_3N_4)_n(Al_2O_3)_m$ (where n and m are positive integers) is provided between the second gate insulating film 17 and the gate electrode 18. The first gate insulating film 16 functions as a diffusion prevention layer for boron in the gate electrode 18.

The material having a chemical composition expressed by $(Si_3N_4)_n(Al_2O_3)_m$ (where n and m are positive integers) in the present embodiment is a binary system of $Si_3N_4$ and $Al_2O_3$. Also, four kinds of atoms having different coordination numbers are mixed. Even when the thermal treatment is applied to this material, since the binary material containing the four kinds of atoms having different coordination numbers is mixed to cause entropy to increase, a stoichiometric chemical composition is easily achieved, defects (dangling bonds) are rarely generated, and a dense structure similar to close packing is easily formed. Also, since the defects are rarely generated in the material, amorphous-to-polycrystalline transformation rarely occurs.

According to the present embodiment, since the first gate insulating film 16 has a dense structure, diffusion of the impurity contained in the gate electrode 18 as a dopant is effectively restricted. Also, since the density of the trapping levels in the first gate insulating film 16 is low, the charge trapping rarely occurs, and lowering of the reliability of the MOSFET is restricted. Further, since the first gate insulating film 16 is amorphous, the increase in gate leakage current is restricted.

In addition, $(Si_3N_4)_n(Al_2O_3)_m$ exerts a diffusion prevention effect for hydrogen (H) as well as the diffusion prevention effect for the impurity such as the boron contained in the gate electrode 18. Accordingly, a characteristic fluctuation of the MOSFET caused by diffusion of the hydrogen in the semiconductor region can be restricted, for example.

Meanwhile, in terms of n and m in $(Si_3N_4)_n(Al_2O_3)_m$ (where n and m are positive integers), n≤m is preferable, and n<m is more preferable. By increasing the ratio of $Al_2O_3$, which is denser than $Si_3N_4$, the denser gate insulating film can be achieved. Accordingly, the diffusion prevention effect for the impurity is improved.

As described above, according to the present embodiment, the MOSFET having high threshold voltage and high reliability is achieved.

Fifth Embodiment

A semiconductor device according to the present embodiment differs from that according to the first embodiment in that the semiconductor device is a HEMT (High Electron Mobility Transistor) using a GaN-based semiconductor. In a similar manner to that in the first embodiment, a semiconductor device according to the present embodiment includes a semiconductor region, a gate electrode, and a first gate insulating film provided between the semiconductor region and the gate electrode and containing a material having a chemical composition expressed by $(SiO_2)_n(Si_3N_4)_m$ (where n and m are positive integers), in the material, at least one silicon atom being bonded with at least one oxygen atom and at least one nitrogen atom. Description of the duplicate contents with those in the first embodiment or the second embodiment, such as details of the first gate insulating film, is omitted.

Figure 4:
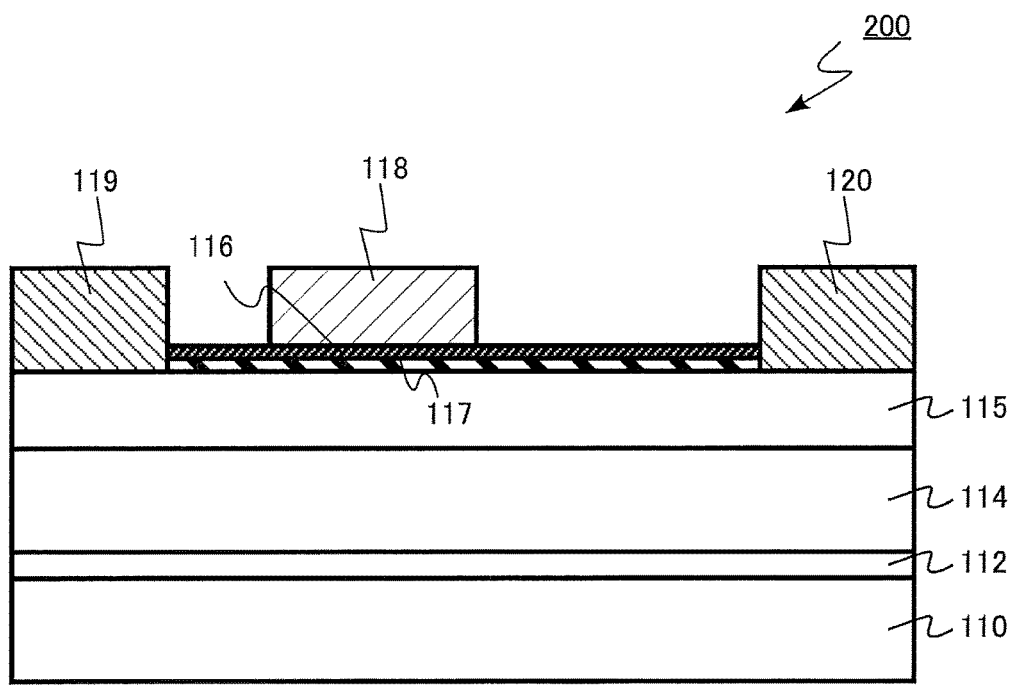
FIG. 4 is a schematic cross-sectional view illustrating a semiconductor device according to a second embodiment.

FIG. 4 is a schematic cross-sectional view illustrating a configuration of a HEMT serving as a semiconductor device according to the present embodiment.

As illustrated in FIG. 4, a semiconductor device (HEMT) 200 includes a substrate 110, a buffer layer 112, a channel layer 114, a barrier layer (semiconductor region) 115, a source electrode 119, a drain electrode 120, a first gate insulating film 116, a second gate insulating film 117, and a gate electrode 118.

The substrate 110 is made of silicon (Si), for example. Instead of the silicon, sapphire ($Al_2O_3$) or silicon carbide (SiC) can also be applied, for example.

The buffer layer 112 is provided on the substrate 110. The buffer layer 112 functions to alleviate a lattice mismatch between the substrate 110 and the channel layer 114. The buffer layer 112 has a multilayer structure of aluminum gallium nitride ($Al_WGa_{1-W}N$ (0<W<1)), for example.

The channel layer 114 is provided on the buffer layer 112. The channel layer 114 is also referred to as an electron transit layer. The channel layer 114 is undoped $Al_XGa_{1-X}N$ (0≤X<1), for example. A more specific example thereof is undoped GaN. The film thickness of the channel layer 114 is 0.1 μm or longer and 10 μm or shorter, for example.

The barrier layer 115 is provided on the channel layer 114. The barrier layer 115 is also referred to as an electron supply layer. A bandgap of the barrier layer 115 is larger than a bandgap of the channel layer 114. The barrier layer 115 is undoped $Al_YGa_{1-Y}N$ (0<Y≤1, X<Y), for example. A more specific example thereof is undoped $Al_{0.25}Ga_{0.75}N$. The film thickness of the barrier layer 115 is 10 nm or longer and 100 nm or shorter, for example.

An interface between the channel layer 114 and the barrier layer 115 is a heterojunction interface. At the heterojunction interface of the HEMT 200, two-dimensional electron gas (2DEG) is formed and serves as a carrier.

The source electrode 119 and the drain electrode 120 are formed on the barrier layer 115. The source electrode 119 and the drain electrode 120 are metal electrodes, for example, and an example of the metal electrode is a stacked structure of titanium (Ti) and aluminum (Al). The source electrode 119 and the drain electrode 120 are preferably brought into ohmic contact with the barrier layer 115. The distance between the source electrode 119 and the drain electrode 120 is 5 μm or longer and 30 μm or shorter, for example.

The barrier layer 115 between the source electrode 119 and the drain electrode 120 is provided with the gate electrode 118. The gate electrode 118 is a metal electrode, for example. An example of the metal electrode is titanium nitride (TiN).

The film thickness of the first gate insulating film 116 is 0.5 nm or longer and 30 nm or shorter, for example.

The first gate insulating film 116 substantially contains a material having a chemical composition expressed by $(SiO_2)_n (Si_3N_4)_m$ (where n and m are positive integers). Meanwhile, n and m have only to be positive integers in a range of measurement tolerances and manufacturing variations. The actual range of the measurement tolerances and manufacturing variations can be approximately several % to 10% of stoichiometry. Also, in the material, at least one silicon (Si) atom is bonded with at least one oxygen (O) atom and at least one nitrogen (N) atom.

The second gate insulating film 117 is made of a different material from that for the first gate insulating film 116. The second gate insulating film 117 is a stacked film of a silicon nitride film having a film thickness of 0.3 nm or longer and 2 nm or shorter provided on the barrier layer 115 and a silicon oxide film having a film thickness of 10 nm or longer and 30 nm or shorter, for example.

The gate electrode 118 is provided on the first gate insulating film 116. The gate electrode 118 is a stacked film of polycrystalline 3C-SiC containing boron (B) as a p-type impurity and polycrystalline silicon containing boron (B) as a p-type impurity, for example.

The film thickness of the polycrystalline 3C-SiC is 3 nm or longer and 10 nm or shorter, for example. Also, the film thickness of the polycrystalline silicon is 20 nm or longer and 30 nm or shorter, for example.

According to the present embodiment, due to the similar functions to those in the first embodiment, diffusion of the impurity is restricted by the first gate insulating film 116, and the HEMT having high reliability is achieved. Also, by applying the 3C-SiC to the gate electrode 118, due to the similar functions to those in the second embodiment, the HEMT having high threshold voltage can be achieved.

It is to be noted that, instead of the material for the first gate insulating film 116 in the present embodiment, the material described in the third or fourth embodiment can also be applied.

Although the case of using the SiC-based or GaN-based semiconductor as the semiconductor region has been taken as an example in each of the first to fifth embodiments, silicon (Si) or another semiconductor material can also be applied as the semiconductor region.

Although the case of using the 4H-SiC as the SiC substrate has been illustrated in each of the first to fourth embodiments, another SiC crystal form, such as 3C—SiC and 6H-SiC, can be used.

Although the boron (B) is taken as an example of the impurity for diffusion prevention in each of the first to fifth embodiments, the impurity for diffusion prevention may be another impurity instead of the boron (B) such as Al (aluminum), Ga (gallium), In (indium), Mg (magnesium), nitrogen (N), phosphorus (P), arsenic (As), antimony (Sb), ruthenium (Ru), and hydrogen (H).

Although the case of using the polycrystalline silicon (Si) or the polycrystalline silicon carbide (SiC) containing the boron as the material for the gate electrode has been taken as an example in each of the first to fifth embodiments, the material for the gate electrode is not particularly limited. For example, another material may also be applied such as polycrystalline silicon carbide containing at least one element selected from aluminum, gallium, and indium other than the boron, carbon (C) (B-doped polycrystalline diamond), a GaN-based semiconductor such as polycrystalline gallium nitride containing magnesium (Mg), polycrystalline aluminum nitride containing magnesium (Mg), and polycrystalline aluminum gallium nitride containing magnesium (Mg), and metal oxide such as strontium titanate containing ruthenium (Ru). Also, the gate electrode may be a stacked structure of a polycrystalline semiconductor layer and a metal layer such as boron-doped polycrystalline silicon and titanium nitride (TiN). Alternatively, the gate electrode may be a stacked structure of a polycrystalline semiconductor layer and a polycrystalline semiconductor layer such as boron-doped 3C polycrystalline silicon carbide and boron-doped polycrystalline silicon.

Although the configuration in which the second gate insulating film 17 or 117 is provided between the semiconductor region and the first gate insulating film 16 or 116 has been taken as an example in each of the first to fifth embodiment, a configuration without the second gate insulating film 17 or 117 can also be employed.

Although the n-type MOSFET is taken as an example of the semiconductor device in each of the first to fourth embodiments, the present disclosure can be applied to a p-type MOSFET.

Although the planar MOSFET is taken as an example of the semiconductor device in each of the first to fourth embodiments, the present disclosure can be applied to a trench MOSFET.

Although the MOSFET is taken as an example of the semiconductor device in each of the first to fourth embodiments, the present disclosure can also be applied to another semiconductor device, such as an IGBT (Insulated Gate Bipolar Transistor), as long as it is a semiconductor device having the MIS structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor region;
   a gate electrode; and
   a first gate insulating film provided between the semiconductor region and the gate electrode, the first gate insulating film containing a first material having a chemical composition expressed by $(SiO_2)_n(AlN)_m$ (where n and m are positive integers), at least one silicon atom or one aluminum atom included in the first material being bonded with at least one oxygen atom and at least one nitrogen atom,
   wherein
   $SiO_2$ and AlN are mixed to have an integrated structure in the first material.

2. The device according to claim 1, wherein the number of silicon atoms included in the first material bonded with at least one oxygen atom and at least one nitrogen atom is more than the number of silicon atoms bonded only with oxygen atoms and the number of silicon atoms included in the first material bonded with at least one oxygen atom and at least one nitrogen atom is more than the number of silicon atoms bonded only with nitrogen atoms.

3. The device according to claim 1, wherein the number of aluminum atoms included in the first material bonded with at least one oxygen atom and at least one nitrogen atom is more than the number of aluminum atoms bonded only with oxygen atoms and the number of aluminum atoms included in the first material bonded with at least one oxygen atom and at least one nitrogen atom is more than the number of aluminum atoms bonded only with nitrogen atoms.

4. The device according to claim 1, wherein n≤m.

5. The device according to claim 1, wherein n=m=1.

6. The device according to claim 1, further comprising a second gate insulating film provided between the semiconductor region and the first gate insulating film, the second gate insulating film containing a second material different from the first material.

7. The device according to claim 1, wherein the gate electrode includes at least one material selected from polycrystalline silicon containing boron, polycrystalline silicon carbide containing at least one element selected from boron, aluminum, gallium, and indium, polycrystalline gallium nitride containing magnesium, polycrystalline aluminum nitride containing magnesium, polycrystalline aluminum gallium nitride containing magnesium, and strontium titanate containing ruthenium.

8. The device according to claim 1, wherein the semiconductor region is silicon carbide.

9. The device according to claim 1, wherein the first gate insulating film is amorphous.

\* \* \* \* \*